United States Patent [19]

Meier et al.

[11] Patent Number: 5,140,174
[45] Date of Patent: Aug. 18, 1992

[54] SYMMETRIC EDGE TRUE/COMPLEMENT BUFFER/INVERTER AND METHOD THEREFOR

[75] Inventors: Peter Meier, Fort Collins; Ken DelGrande, Bellvue, both of Colo.

[73] Assignee: Hewlett-Packard Co., Palo Alto, Calif.

[21] Appl. No.: 645,952

[22] Filed: Jan. 25, 1991

[51] Int. Cl.$^5$ .................. H03K 5/13; H03K 19/00
[52] U.S. Cl. ................... 307/269; 307/480; 307/481; 307/262; 307/582; 328/63
[58] Field of Search ............... 307/269, 480, 481, 262, 307/582; 328/62, 63, 55, 57, 118

[56] References Cited

U.S. PATENT DOCUMENTS

| | | | |
|---|---|---|---|
| 4,074,148 | 2/1978 | Sato | 307/269 |
| 4,130,768 | 12/1978 | Bula et al. | 307/475 |
| 4,149,099 | 4/1979 | Nagami | 307/475 |
| 4,529,896 | 7/1985 | Grandguillot et al. | 307/480 |
| 4,547,684 | 10/1985 | Pechar | 307/269 |
| 4,783,604 | 11/1988 | Ueno | 307/269 |
| 4,950,920 | 8/1990 | Hara et al. | 307/269 |

Primary Examiner—Edward P. Westin
Assistant Examiner—Richard Roseen
Attorney, Agent, or Firm—Guy J. Kelley

[57] ABSTRACT

The present invention is directed to a buffer/inverter which generates symmetric and complementary output signals from a single input signal. The device employs four inverters having similar switching speeds. The true output signal is generated by passing the input signal through two inverters. The complement output signal is generated by passing the true output signal through a third inverter, passing the input signal through a fourth inverter and coupling the outputs of the third and fourth inverters.

14 Claims, 2 Drawing Sheets

SYMMETRIC EDGE TRUE/COMPLEMENT BUFFER/INVERTER AND METHOD THEREFOR

BACKGROUND OF THE INVENTION

1. Field of the Invention

The present invention relates generally to a circuit and method for generating symmetric and complementary signals from a single signal, and more particularly, to a buffer/inverter.

2. Related Art

Various electronic circuits require symmetric and complementary clock signals. "Symmetric and complementary signals" are hereby defined to be two signals which at any point in time have voltage levels of approximately equal magnitude but of opposite polarity. Two clocks of the same frequency could generate such signals. However, synchronizing the clocks would be difficult.

A more common solution is to use a device called a buffer/inverter to generate symmetric and complementary signals from a single clock signal. Conventional buffer/inverters are implemented with a chain of an even number of inverters for generating a true signal and a chain of an odd number of inverters for generating a complement signal.

FIG. 1 is a schematic of a conventional buffer/inverter 100. An input terminal 104 is connected to the input of a first inverter 106. The output of the first inverter 106 is connected to the input of a second inverter 108. The output of the second inverter 108 is connected to a true output terminal 102.

The input terminal 104 is also connected to the input of a third inverter 112. The output of the third inverter is connected to a complement output terminal 110.

In an attempt to generate symmetric and complementary signals, conventional buffer/inverters are implemented with inverters in the longer chain having proportionately faster switching times than the inverter or inverters in the shorter chain. Thus, the first and second inverters 106, 108 would switch twice as fast as the third inverter 112.

The switching time of a FET inverter is approximately proportional to the dimensions of its channel. However, intrinsic delay and process variations make it difficult to manufacture an integrated circuit with inverters having various specified switching speeds. Because intrinsic delay is approximately constant, it is difficult to determine the appropriate channel dimensions for inverters of various speeds.

Even if the channel dimensions are determined, process variations make it unlikely that the inverters will have the specified speeds. Process variations are approximately constant for all inverters on an integrated circuit. Therefore, for example, if some inverters on an integrated circuit were specified to have twice the channel width of others, and if the process variation caused an increase in channel width, the wider-channeled inverters could be less than twice as fast as those with the narrower channels. Alternatively, if the process variation caused a decrease in channel width, the wider-channeled inverters could be more than twice as fast as those with the narrower channels.

Because of the difficulty in producing inverters of various specified switching speeds, the output signals of conventional buffer/inverters may not be symmetric and complementary.

SUMMARY OF THE INVENTION

The present invention relates to a buffer/inverter that can receive an input signal and generate first and second output signals which are symmetric and complementary. In one embodiment, the buffer/inverter comprises an input terminal, a true output terminal, a complement output terminal and four inverters having approximately the same switching speed. The input terminal is connected to the input of the first inverter. The output of the first inverter is connected to the input of the second inverter. The output of the second inverter is connected to the true output terminal.

The output of the second inverter is also connected to the input of the third inverter. The input terminal is connected to the input of the fourth inverter. The outputs of the third and fourth inverters are coupled together and connected to the complement output terminal.

The first, second, third and fourth inverters are fabricated on the same chip and designed to have substantially the same switching speed.

The first, second, third and fourth inverters are CMOS devices. However, the first, second, third and fourth inverters could be implemented with other switching and/or process technologies.

Furthermore, and by way of example only, the inverter logic may be replaced with numerous other logic configurations. Such other logic configurations could comprise, for example, NAND gates, NOR gates or some combination thereof.

BRIEF DESCRIPTION OF THE DRAWINGS

The present invention will be more fully understood with reference to the accompanying drawings in which.

DETAILED DESCRIPTION OF THE PREFERRED EMBODIMENT

Figure 1:
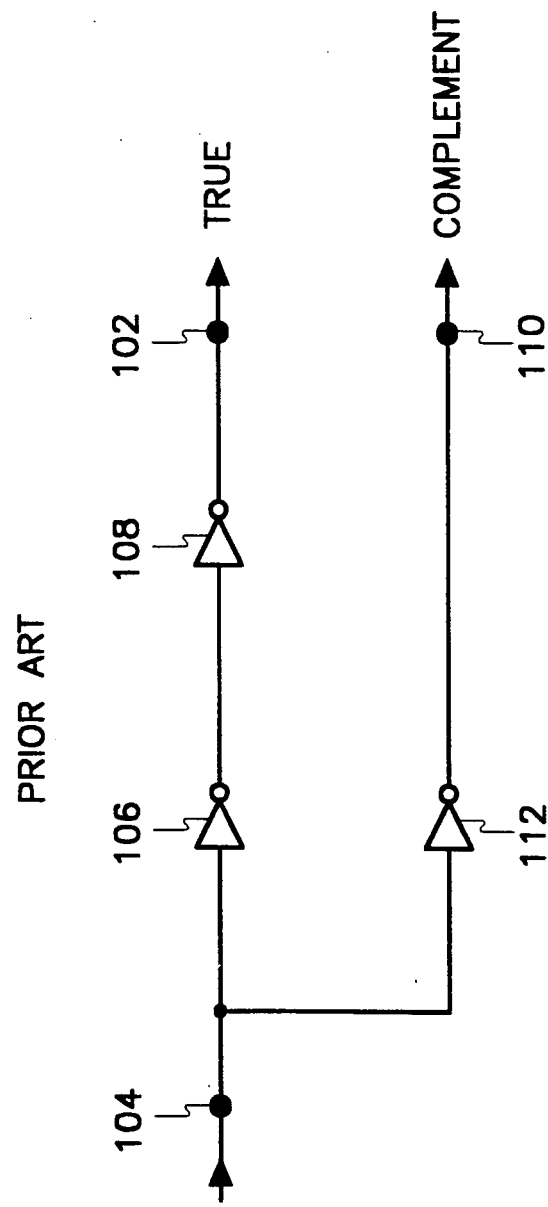
FIG. 1 shows a schematic for a conventional buffer/inverter.
Figure 2:
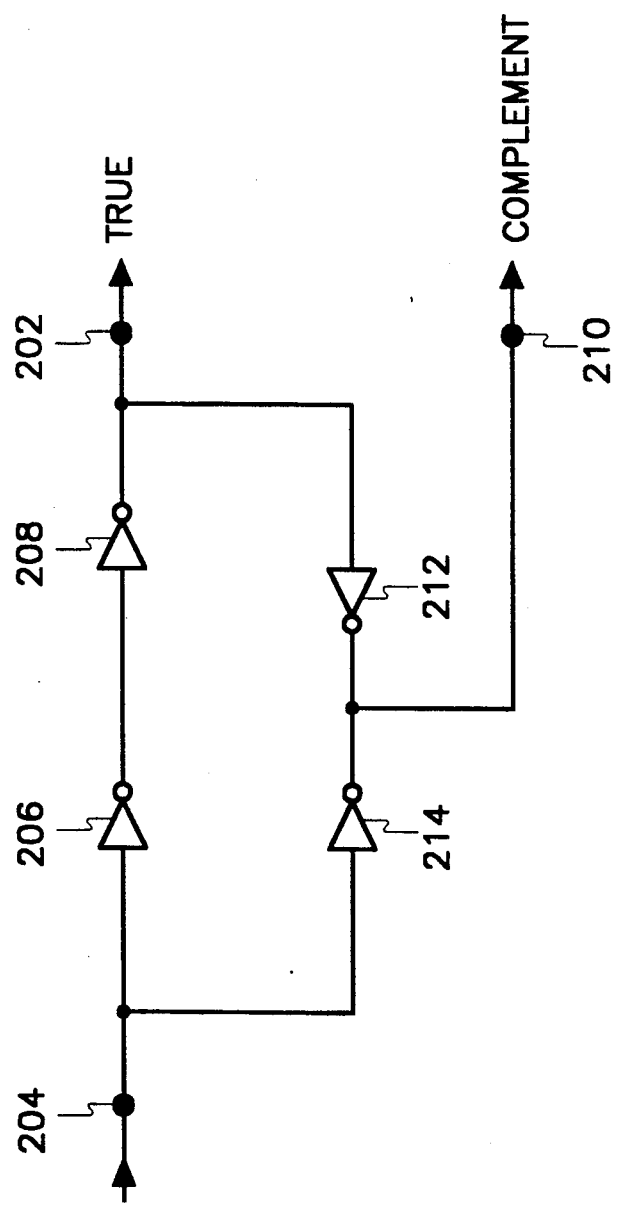
FIG. 2 shows a schematic for the buffer/inverter of the present invention.

The present invention is a buffer/inverter and method therefor that generate symmetric and complementary output signals from a single input signal. Referring to FIG. 2, the structure of the buffer/inverter 200 is shown. The buffer/inverter 200 comprises an input terminal 204, a first inverter 206, a second inverter 208, a third inverter 212, a fourth inverter 214, a true output terminal 202 and a complement output terminal 210. The input terminal 204 is connected to the input of the first inverter 206. The output of the first inverter 206 is connected to the input of the second inverter 208. The output of the second inverter 208 is connected to the true output terminal 202.

The output of the second inverter 208 is also connected to the input of the third inverter 212. The input terminal 204 is connected to the input of the fourth inverter 214. The outputs of the third inverter 212 and the fourth inverter 214 are connected to the complement output terminal 210.

In the preferred embodiment, the buffer/inverter 200 is fabricated as an integrated circuit on a chip. By way of example only, the buffer/inverter 200 may be formed on a VLSI chip. Each of the inverters 206, 208, 212, and 214 are fabricated on the same chip and designed to have substantially the same switching speeds. This is accomplished by appropriate sizing of the transistor channels that typically form an inverter.

In the preferred embodiment, the inverters 206, 208, 212, and 214 comprise CMOS based transistors. Alternatively, the inverters 206, 208, 212, and 214 may comprise other switching and/or process technologies.

Furthermore, and by way of example only, the inverter logic may be replaced with numerous other logic configurations. Such other logic configurations could comprise, for example, NAND gates, NOR gates or some combination thereof.

The operation of the buffer/inverter 200 will now be discussed. The buffer/inverter 200 generates a true output signal by passing an input signal on the input terminal 204 through the first inverter 206 and the second inverter 208. As a result, the true output signal on the output terminal 202 will be delayed by two gate delays.

The buffer/inverter 200 generates a complement output signal by passing the true output signal through the third inverter 212, passing the input signal through a fourth inverter 214 and coupling the outputs of the third and fourth inverters 212 and 214.

When the level at the input terminal 204 switches from high to low, the complement signal switches as follows. The input to the fourth inverter 214 goes low and the fourth inverter begins to pull up the level at the complement output terminal 210. Initially, the third inverter 212 will have a high input and will prevent the fourth inverter 214 from pulling the level at the complement output terminal 210 completely high. When the level of the input to the third inverter 212 subsequently begins to fall, however, the third inverter 212 will pull the level at the complement output terminal 210 to a full high. When the level at the input terminal 204 switches from a low to a high, the complement signal switches from high to low in a similar manner.

The delay of the complement output signal will be approximately two gate delays. This is substantially the average amount of delay when the output of the third inverter 212 (three gate delays) is coupled with the output of the fourth inverter 214 (one gate delay). Because the inverters 206, 208, 212, and 214 are of similar speed, any intrinsic delay or process variations will affect all of them approximately equally. The inverters 206, 208, 212, and 214 will therefore have approximately identical gate delays. Because both the true output signal and the complement output signal each follow the input signal by two gate delays, the output signals will be symmetric.

In the preferred embodiment, a chain having an even number of inverters (inverters 206 and 208) generates the true output signal. Similarly, a first chain (inverter 214) and a second chain (inverters 206, 208, and 212) coupled together and each having an odd number of inverters generates the complement output signal.

While the preferred embodiment has been set forth, various modifications, alterations and changes may be made without departing from the spirit and scope of the present invention as defined in the appended claims.

What is claimed is:

1. A buffer/inverter that receives an input signal and generates first and second output signals which are symmetric and complementary, which buffer/inverter comprises:

(a) a first inverter having an input terminal and an output terminal, said input terminal being connected to receive the input signal;

(b) a second inverter having an input terminal and an output terminal, said input terminal of said second inverter being connected to said output terminal of said first inverter, and said output terminal of said second inverter being connected to produce the first output signal;

(c) a third inverter having an input terminal and an output terminal, said input terminal of said third inverter being connected to said output terminal of said second inverter;

(d) a fourth inverter having an input terminal and an output terminal, said input terminal of said fourth inverter being connected to receive the input signal; and (e) said output terminal of said third inverter and said output terminal of said fourth inverter being coupled together to generate the second output signal.

2. The buffer/inverter of claim 1, wherein said first, second, third and fourth inverters are formed on the same chip.

3. The buffer/inverter of claim 2, wherein said first, second, third and fourth inverters are of similar switching speeds.

4. The buffer/inverter of claim 3, wherein said first, second, third and fourth inverters are CMOS devices.

5. A system for generating from an input signal a first output signal and a second output signal which is symmetric and complementary to the first output signal, comprising:

(a) a first inverting means for delaying and inverting the input signal so as to generate a first intermediate signal;

(b) a second inverting means for delaying and inverting said first intermediate signal so as to generate the first output signal;

(c) a third inverting means for delaying and inverting the first output signal so as to generate a second intermediate signal;

(d) a fourth inverting means for delaying and inverting the input signal so as to generate a third intermediate signal; and (e) a coupling means for coupling said second and third intermediate signals so as to generate the second output signal.

6. The system of claim 5, wherein any of said first, second, third and fourth inverting means is an inverter.

7. The system of claim 5, wherein any of said first, second, third and fourth inverting means is a NAND gate.

8. The system of claim 5, wherein any of said first, second, third and fourth inverting means is a NOR gate.

9. The system of claim 5, wherein any of said first, second, third and fourth inverting means is a AND-OR-invert gate.

10. The system of claim 5, wherein any of said first, second, third and fourth inverting means is a OR-AND-invert gate.

11. The system of claim 5, wherein said first, second, third and fourth inverting means are formed on a single chip.

12. The system of claim 5, wherein said first, second, third and fourth inverting means are CMOS devices.

13. The system of claim 5, wherein said first, second, third and fourth inverting means have a switching speed which is substantially the same.

14. The system of claim 5, wherein said coupling means is an electrical connection between an output of said third inverting means and an output of said fourth inverting means.

* * * * *